United States Patent
Segler, Jr. et al.

(10) Patent No.: US 12,153,746 B1
(45) Date of Patent: Nov. 26, 2024

(54) ELECTRONIC DEVICES WITH ILLUMINATED RECONFIGURABLE TOUCH CONTROLS AND NOTIFICATIONS

(71) Applicant: Apple Inc., Cupertino, CA (US)

(72) Inventors: Dana F Segler, Jr., Gilroy, CA (US); Wei Chen, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 170 days.

(21) Appl. No.: 17/698,669

(22) Filed: Mar. 18, 2022

Related U.S. Application Data

(60) Provisional application No. 63/169,544, filed on Apr. 1, 2021.

(51) Int. Cl.
| | |
|---|---|
| *H10K 59/40* | (2023.01) |
| *F21V 8/00* | (2006.01) |
| *G02B 30/27* | (2020.01) |
| *G02F 1/1333* | (2006.01) |
| *G02F 1/1335* | (2006.01) |
| *G02F 1/13357* | (2006.01) |
| *G06F 3/033* | (2013.01) |
| *G06F 3/0354* | (2013.01) |

(52) U.S. Cl.
CPC ....... *G06F 3/03547* (2013.01); *G02B 6/0043* (2013.01); *G02B 30/27* (2020.01); *G02F 1/13338* (2013.01); *G02F 1/133512* (2013.01); *G02F 1/133617* (2013.01); *H10K 59/40* (2023.02)

(58) Field of Classification Search
CPC ... G06F 3/03547; G06F 3/033; G02B 6/0043; G02B 30/27; G02F 1/13338; G02F 1/133512; G02F 1/133617; H10K 59/40
See application file for complete search history.

(56) References Cited

U.S. PATENT DOCUMENTS

| | | |
|---|---|---|
| 6,285,345 B1 | 9/2001 | Crossland et al. |
| 7,088,335 B2 | 8/2006 | Hunter et al. |
| 7,746,423 B2 | 6/2010 | Im et al. |
| | (Continued) | |

FOREIGN PATENT DOCUMENTS

WO 2007100458 A1 9/2007

OTHER PUBLICATIONS

Johannes Schad et al., Vanishing Buttons, Leonhard Kurz Stiftung & Co. KG, Fuerth, Germany, Appliance Design, Apr. 2017.

*Primary Examiner* — Pegeman Karimi
(74) *Attorney, Agent, or Firm* — Treyz Law Group, P.C.; G. Victor Treyz; Jinie M. Guihan

(57) ABSTRACT

An electronic device may have a surface area that may or may not overlap a touch sensor and that may be illuminated. The surface area may have an appearance that matches adjacent housing surfaces when not illuminated from within the device. When it is desired to create notifications or reconfigurable touch controls, a pixel array under the surface area may be used to produce patterned illumination. A louver layer may be interposed between the pixel array and the surface area. The louver layer may have louvers that are tilted with respect to a surface normal associated with the surface area. The louver layer may have cores and claddings that are formed from materials that help impart a non-black appearance to the surface area when corresponding portions of the underlying pixel array are inactive and not emitting light.

44 Claims, 13 Drawing Sheets

(56) References Cited

U.S. PATENT DOCUMENTS

| | | |
|---|---|---|
| 10,578,912 B2 | 3/2020 | Nugraha et al. |
| 2019/0162990 A1* | 5/2019 | Nishimura .............. G02F 1/167 |
| 2019/0219870 A1* | 7/2019 | Nugraha ............. G06F 13/4027 |
| 2019/0285937 A1* | 9/2019 | Fuchida ................... G02B 5/02 |
| 2019/0346939 A1* | 11/2019 | Na ........................ G06F 3/0418 |
| 2019/0391418 A1* | 12/2019 | Yamaguchi ........ G02F 1/136277 |
| 2021/0005677 A1* | 1/2021 | Lee ..................... G06F 3/04166 |
| 2022/0171274 A1* | 6/2022 | Yoshizawa ............... G02B 5/00 |
| 2022/0350072 A1* | 11/2022 | Fattal ..................... G02B 30/30 |

\* cited by examiner

ELECTRONIC DEVICES WITH ILLUMINATED RECONFIGURABLE TOUCH CONTROLS AND NOTIFICATIONS

This application claims the benefit of U.S. Provisional Application No. 63/169,544, filed Apr. 1, 2021, which is hereby incorporated by reference herein in its entirety.

FIELD

This relates generally to electronic devices, and, more particularly, electronic devices with touch sensors.

BACKGROUND

Electronic devices may have touch sensors. For example, a laptop computer may have a track pad with touch sensor. During operation of the laptop computer, a user may provide touch input to the trackpad to control the laptop computer.

SUMMARY

An electronic device may have a touch sensitive surface area that is configured to receive touch input such as a trackpad surface area. Adjustable illumination may be provided that creates illuminated touch sensor controls in the touch sensitive area.

A trackpad surface area or other touch sensitive area on an electronic device housing may be provided with an appearance when not illuminated from within that has a non-black appearance such as a neutral appearance (e.g., white or gray) or a non-neutral color (e.g., gold, red, blue, etc.).

When it is desired to create reconfigurable buttons or other reconfigurable controls on the trackpad surface area, a pixel array under the trackpad surface area may be used to produce illumination. The portion of the trackpad surface area that is currently active and responding to touch input may be adjusted dynamically. For example, the trackpad surface area may have an active area that can be moved between a left half of the trackpad surface area and a right half of the trackpad surface area.

A louver layer may be interposed between the pixel array and the trackpad surface area. The louver layer may have louvers that are tilted with respect to a surface normal associated with the trackpad surface area. The presence of the louver layer may help prevent the pixel array from appearing black when not illuminated, thereby providing the trackpad surface area of the device with an attractive appearance and an appearance that matches that of other portions of the exterior surface of the device.

Light from the pixel array may pass through the louver layer. The louver layer and/or other layers between the touch sensitive surface and the pixel array may have cores and claddings that are formed from materials that impart a non-black appearance (e.g., a white appearance, a gray appearance, or a non-neutral color), a desired haze (e.g., a frosted appearance), and/or other desired appearance to the touch sensitive surface area when corresponding portions of the pixel array are inactive and not emitting light.

Colored materials, light-scattering structures, and/or adjustable components may be incorporated into the louver layer or other portions of the layers under the trackpad surface area and above the pixel array to impart desired fixed and/or adjustable optical properties. These properties may include, for example, desired neutral or non-neutral colors, desired amounts of haze, desired amounts of opacity, and/or other desired properties that affect the appearance of the trackpad surface area.

DETAILED DESCRIPTION

An electronic device may have one or more touch sensitive surface areas. A touch sensitive surface area may overlap a touch sensor that is selectively illuminated to create illuminated reconfigurable touch controls.

To provide the touch sensitive surface area with an attractive appearance such as an appearance that matches that of adjacent housing structures, partially transparent layers may overlap and hide the touch sensor. These partially transparent layers may have a desired neutral or non-neutral color. The partially transparent layers may include a layer of louvers covering a pixel array that can be used to provide adjustable illumination for the touch sensitive surface area. For example, adjustable illuminated icon-shaped buttons or other reconfigurable touch controls can be displayed through the partially transparent layers in some modes of operation. In other modes of operation, all illumination may be turned off.

The partially transparent layers are preferably sufficiently opaque to provide the touch sensitive surface area with an opaque appearance such as a non-black appearance that matches the appearance of other exterior surfaces of the device. When touch sensor illumination is turned off, for example, the outer surface of the electronic device in the touch sensor area may have a neutral color appearance such as a light gray or dark gray appearance (e.g., a silver/gray appearance that matches the appearance of a silver/gray laptop computer housing, etc.). If desired, coloration may be provided to the partially transparent layers so that the surface of the electronic device overlapping the touch sensor area has a non-neutral color (e.g., gold, rose gold, blue, green, red, etc.).

Figure 1:
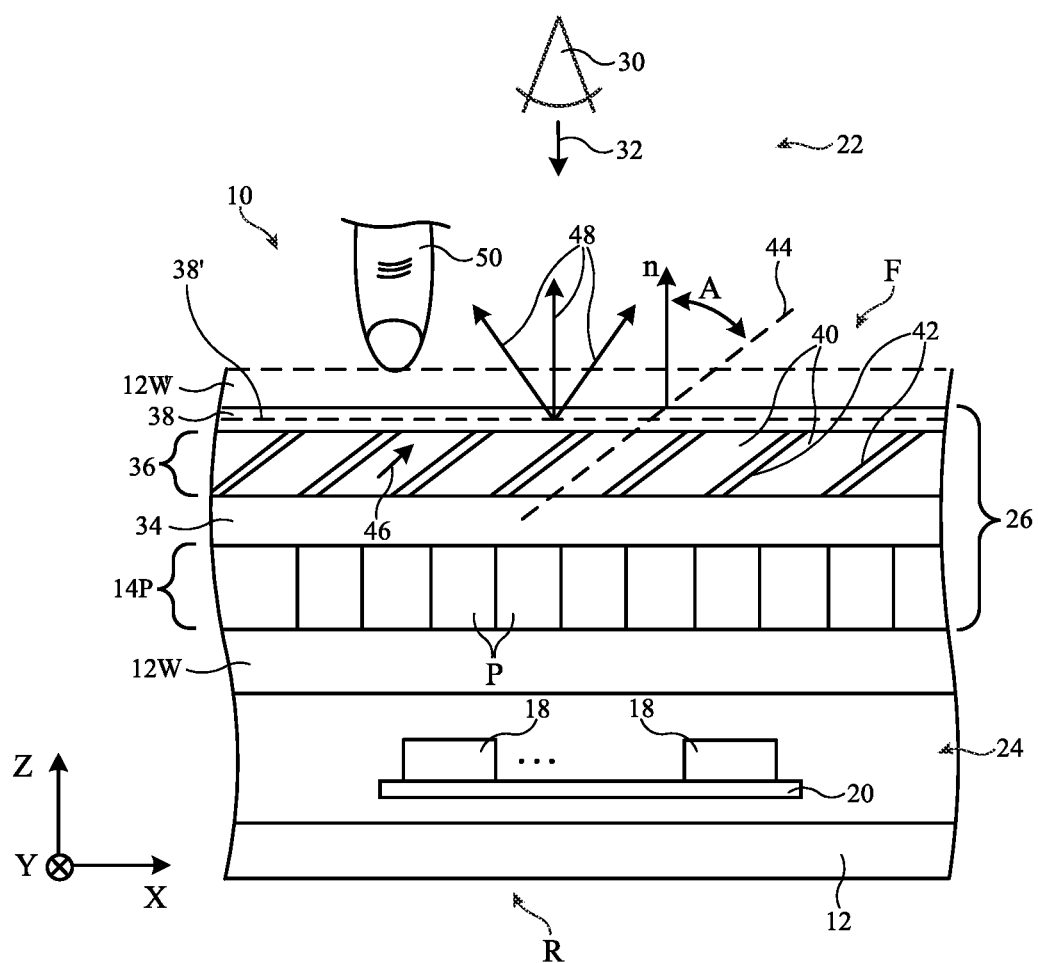
FIG. 1 is a cross-sectional side view of an illustrative electronic device in accordance with an embodiment.

A cross-sectional side view of a portion of an illustrative electronic device with a touch sensor that is covered by a partially transparent layer (sometimes referred to as a partially transparent sensor cover layer or partially transparent sensor cover structure) is shown in FIG. 1. In general, device 10 of FIG. 1 may be any suitable electronic device. For example, electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a head-mounted device such as eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a removable battery case such as an enclosure for a head-mounted device, a removable cellular telephone battery case, a battery case for holding earbuds or other accessories, equipment that implements the functionality of two or more of these devices, or other electronic equipment. Illustrative configurations in which device 10 is a portable device such as a laptop computer of may sometimes be described herein as an example.

As shown in FIG. 1, device 10 may have a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. The appearance of the some or all of the exterior surfaces of housing 12 may be neutral in color such as white or silver (gray) and/or may be non-neutral in color. Housing 12 may be configured to form structural layers such as housing walls. The housing walls may enclose one or more interior regions such as interior region 24 and may separate interior region 24 from exterior region 22. Components 18 may be mounted in interior 24 (e.g., using one or more substrates such as printed circuit 20). Components 18 may include control circuitry (e.g., microprocessors, microcontrollers, digital signal processors, baseband processors, application specific integrated circuits, storage such as volatile and/or non-volatile memory), may include input-output devices such as sensors (e.g., ambient light sensors, fingerprint sensors, image sensors, touch sensors, force sensors, accelerometers, etc.), may include output devices such as light-emitting diodes, displays, haptic output devices, audio output devices such as speakers and tone generators, and/or may contain other input-output devices for gathering user input and environmental measurements and for providing output. If desired, components 18 may include cellular telephone transceiver circuitry, wireless local area network circuitry, and other wired and/or wireless communications circuitry. Components 18 may also include a battery for providing device 10 with power. Components In the example of FIG. 1, interior region 24 is sandwiched between upper and lower portions of housing 12. At rear R, housing 12 forms a rear housing wall. At front F, one or more structural layers may form a front housing wall. As an example, front F may have an inner structural layer such as layer 12W and/or an outer structural layer such as layer 12W. Layer 12W and/or layer 12W, which may sometimes be referred to as housing structures, housing walls, structural layers, etc., may be used to support layers 26. Layers 26 may include a touch sensor that covers an area of the surface of device 10 (sometimes referred to as a touch sensor coverage area or touch sensitive surface area). Some or all of layers 26 (and layer 12W) have partially transparent structures that provide the touch sensitive surface area with a desired outward appearance and may sometimes be referred to as partially transparent layers.

Inner layers such as layer 12W may be formed from transparent or opaque material. Outer layers such as layer 12W may be formed from transparent material (e.g., glass or clear polymer) and/or may be formed from partially transparent material (e.g., gray polymer, colored glass, and/or glass, polymer, or other material covered with a partially transparent coating, provided with haze using light-scattering coatings and/or embedded light-scattering structure, etc.). In the example of FIG. 1, layer 12W has been omitted and inner layer 12W is providing structural support for layers 26 and helping to separate exterior region 22 from interior region 24.

Layers 26 may include components that emit light such as pixel array 14P. Pixel array 14P may have a two-dimensional array of pixels P (e.g., light-emitting pixels formed from respective light-emitting diodes or backlit adjustable-transmission pixels such as liquid crystal pixels in a thin-film liquid crystal display that receive backlight illumination from a separate backlight unit). During operation, pixel array 14P may be adjusted to produce light that creates visible icons and other patterns of illumination on the outer surface of device 10 (e.g., on the touch sensitive surface area on front F, where these icons and other patterns of illumination can be viewed by a viewer such as user 30 who is viewing device 10 in direction 32) and/or some or all of the pixels in pixel array 14P may be turned off, so that no interior illumination is visible on front F.

Layers 26 may include structures that form a touch sensor. As shown in FIG. 1, for example, layers 26 may include two-dimensional touch sensor 34. Touch sensor 34 may be a two-dimensional capacitive touch sensor with transparent electrodes (e.g., electrodes formed from transparent conductive material such as indium tin oxide or other transparent conductive electrode material) or may be any other suitable type of touch sensor. During operation, a user may supply touch input to touch sensor 34 (e.g., using an external object that contacts the outer surface of device 10 such as finger 50 or a compute stylus). Touch sensor 34 can detect touch input to determine the location of one or more external objects such as finger 50 in the X and Y dimensions. In arrangements in which device 10 is a laptop computer, the outermost surface of device 10 at front F may correspond to the horizontal top surface of the base (lower) laptop housing in a two-part laptop computer housing (e.g., a housing that has an upper display housing that encloses a display and a lower base housing that encloses a keyboard and track pad). Touch sensor 34 in this configuration may serve as a track pad touch sensor. In devices with other form factors, touch sensor 34 may be oriented vertically and may face to the side, may be oriented horizontally while facing the rear of a device, etc.

Louver layer 36 and optional covering layer 38 may be provided over touch sensor 34 and pixel array 14P to help visually obscure display 14P while providing the exterior of device 10 on front F with a desired opaque appearance. Covering layer 38 may include one or more sublayers 38'. In an illustrative configuration, covering layer 38 may include a diffuser. The diffuser may be formed from a polymer layer containing light-scattering structures such as groove, pits, or other recesses, bumps, ridges, or other protrusions, and/or voids and/or other embedded particles such as inorganic dielectric particles that have refractive index values that differ from the polymer of the polymer layer in which the particles are embedded. Covering layer 38 may also have one or more textured surfaces (e.g., the outer surface of layer 38 may have texture, the inner surface of layer 38 may have texture, etc.). Layer(s) of polymer (e.g., paint) that contains colorant such as dye and/or pigment may form one or more of layers 38'. Layers 38' may also include thin-film coating layers, thin-film interference filters formed from stacks of dielectric layers of alternating refractive index, and/or other sublayers. The presence of layer 38 in layers 26 may help provide device 10 with a desired appearance. For example, layer 38 (and/or other layers in layer 26 and/or layer 12W) may be configured to exhibit a haze of at least 5%, at least 10%, at least 20%, at least 50%, less than 95%, or other suitable amount of haze to provide layers 26 with a hazy (frosted) appearance (e.g., a haze of at least 5%, at least 10%, at least 20%, at least 50%, less than 95%, or other suitable amount of haze). The inclusion of haze in layers 26 and/or layer 12W above pixel array 14P may create a hazy appearance for pixels P, but the haze of layers 26 can enhance the appearance of the touch sensitive surface area and haze in pixels P may be acceptable when using pixels P to illuminate reconfigurable touch controls as opposed to presenting high-resolution imagery of the type typically displayed on a computer display. Layer 38 (and/or other layers in layer 26 and/or layer 12W) may also be configured to provide the touch sensitive surface area on device 10 with a desired color (e.g., a non-black neutral color such as gray or white, a non-neutral color) and that provide the touch sensitive surface area on device 10 with a desired reflectivity for ambient light (e.g., a reflectivity of at least 5%, at least 10%, at least 25%, at least 50%, at least 75%, less than 95%, less than 60%, less than 40%, etc.).

Louver layer 36 may be formed between layer 38 and touch sensor 34 (as an example. Louver layer 36 may have a series of parallel louvers, each of which includes a louver core 40 sandwiched between a pair of louver claddings 42. The louvers run across the touch sensitive area parallel to the Y axis in the example of FIG. 1. Light 46 from pixel array 14P may be guided through the louvers (e.g., claddings 42 may have refractive index values that are lower than cores 20 so that the louvers may form light guides in which light is guided in accordance with the principal of total internal reflection and/or may be high-reflectivity metal coatings or other structures with optical properties that help confine light in the louver cores as the light passes through layer 36. In this way, light 46 that is emitted by the individually adjustable pixels P of layer 14P may pass through layer 36 from the lower surface of layer 36 that faces pixel array 14P to the opposing upper surface of layer 36 that faces away from pixel array 14P.

The louvers of layer 36 may be tilted so that they extend along longitudinal axes that are tilted with respect to surface normal n of the touch sensitive surface area at the exterior surface of device 10 on front F. As shown by illustrative louver longitudinal axis 44, louvers may be tilted away from surface normal n by a non-zero angle A. The value of A may be at least 10°, at least 20°, at least 30°, at least 40°, at least 50°, at least 60°, less than 95° less than 85°, less than 75°, less than 65°, or less than 55° (as examples). When the louvers of louver layer 36 are tilted in this way, structures in layer 36 such as claddings 42 are visible in direction 32, so ambient light illuminating layer 36 and/or light passing through layer 36 from array 14P can be affected by the structures of layer 36. The selection of the materials used in forming claddings 42 and other portions of layer 36 may therefore help provide layer 36 with a desired appearance. (e.g., these structures may be configured to help impart a desired color, haze, opacity, reflectivity, etc.)

When adjusting the appearance of layers 26, thin-film layers (e.g., thin-film metal coatings, thin-film layers of dielectric, etc.), colorant (e.g., dye and/or pigment), and/or light-scattering structures (texture and/or embedded particles) may be included in the structures of louver layer 36 in addition to or instead of providing layer 38 and/or layer 12W with thin-film layers, colorant, and/or light-scattering structures. In this way, the appearance of device 10 may be adjusted by adjusting the structures of layers 36 in addition to or instead of adjusting the structures of layer 38 (and/or layer 12W).

Consider, as an example, a scenario in which one or more thin-film coating layers are included in layer 36 and/or layer 38. The thin-film layers may include metal, semiconductor, and/or dielectric. By adjusting the number of layers, the thickness of the layers, and the composition of the layers, the amount of light reflected, absorbed, and transmitted by layers 26 can be adjusted. As one example, including a thin metal layer in layers 26 may help block light and provide layers 26 with a desired partial transparency and partial mirror reflectivity. In an illustrative configuration, the reflectivity of the surface of device 10 (e.g., layer 12W and layers 26 viewed from direction 32) may be 10-90%, at least 10%, at least 25%, at least 45%, less than 90%, less than 80%, less than 60%, or less than 30% (as examples), the absorption of layers 26 may be 10-90%, at least 10%, at least 25%, at least 45%, less than 90%, less than 80%, less than 60%, or less than 30% (as examples), and the transmission of layers 26 may be 10-90%, at least 10%, at least 25%, at least 45%, less than 90%, less than 80%, less than 60%, or less than 30% (as examples). These properties and other optical properties of layers 26 can also be adjusted by incorporating colorant and/or light-scattering particles into layers 26 and/or layer 12W. As an example, the haze of layers 26 (and/or layer 12W) can be adjusted by including light-scattering structures (e.g., embedded particles) in cores 40 and/or claddings 42 (and/or layer 38 and/or layer 12W) so that the haze has a value of 10-90%, at least 10%, at least 25%, at least 45%, less than 90%, less than 80%, less than 60%, or less than 30% (as examples). In an illustrative configuration, cores 40 and/or claddings 42 (and/or layer 38 and/or layer 12W) may also be provided with colorant (e.g., dye and/or pigment). The colorant may provide layer 36 (and/or layer 38 and/or layer 12W) and therefore the touch sensitive surface area of device 10 with a neutral color (e.g., white, light gray, dark gray, or black) or may provide the touch sensitive surface area with a non-neutral color (e.g., gold, rose gold, red, blue, green, etc.). With sufficient haze in layer 36 and/or layer 38 and/or layer 12W, device 10 may have a diffuse "frosted" outward appearance. By providing layer 36 and/or layer 38 and/or layer 12W with sufficient reflectivity and opacity, the user will not be able to view black ink and other structures in pixel array 14P (i.e., the outward appearance of device 10 need not be a black appearance dictated by black structures in array 14P), but rather may have a more attractive appearance such as a silver appearance, rose gold appearance, gold appearance, white appearance, etc.). The presence of louver layer 36 may also help ensure that the color and other appearance attributes observed by user 30 when viewing device 10 in direction 32 are determined by the color attributes and other appearance attributes of cladding 42, cores 40, etc. This is because the tilt associated with angle A of louvers helps prevent direct viewing of pixels P along the louver cores. On the other hand, when it is desired to illuminate portions of the surface of device 10 overlapping layers 38 and 36, this light may pass through cores 40 to adjacent portions of layer 38. Layer 38 may include a diffuser that diffuses light 46 that reaches layer 48 through the louvers (see, e.g., diffuse light 48, which is created when light 46 passes through a louver and, at the exit to the lover, illuminates a portion of layer 38 and causes layer 38 to scatter light 46 over a wide range of angles). Because diffuse light 48 is produced where light 46 strikes layer 38, it will appear to user 30 that any light patterns produced by pixel array 14P are being created directly in layer 38 (e.g., directly at the exterior surface of device 10 in arrangements in which layer 12W is not present), rather than behind layer 38 at the surface of array 14P. This may help create a pleasing appearance for the illuminated light patterns on device 10. An additional layer between the pixel array 14P and the louvers 36 may be required to properly collimate the light and improve optical efficiency of the illumination thru the layers. This may be in the form of a microlens array, dielectric film stack, Fresnel lens structure, holographic recording, or other diffractive structure that has the ability to properly redirect all angles of illumination from the pixel array directly toward (and effectively normal to) the louver layer 36.

Figure 15:
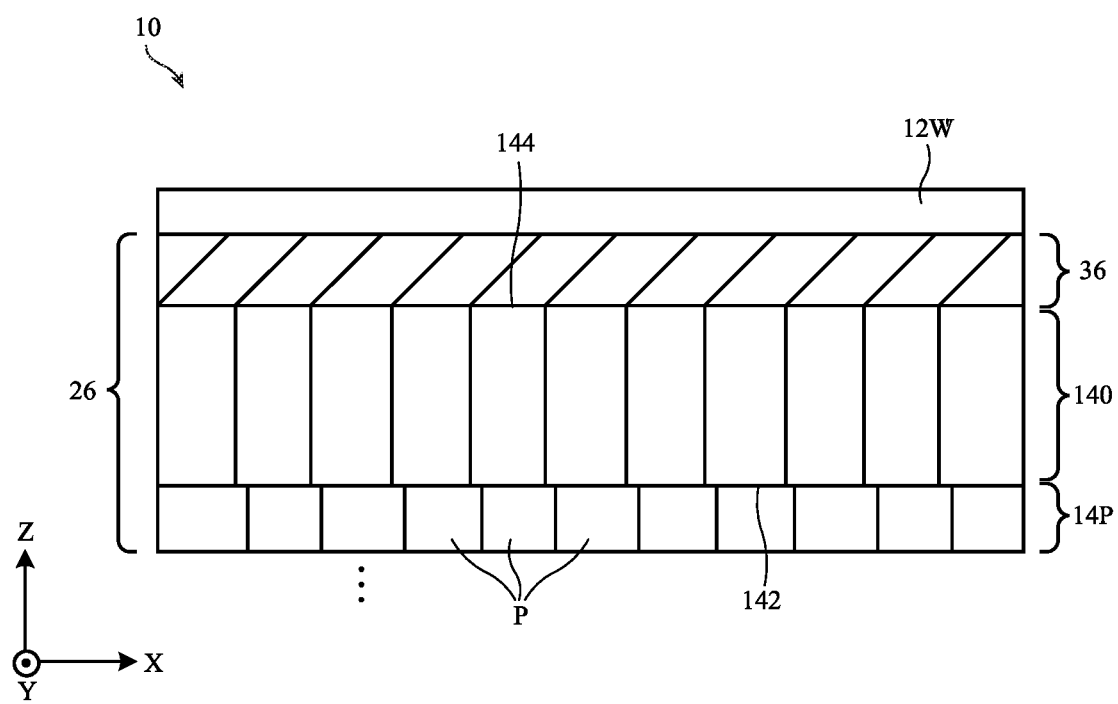
FIG. 15 is a cross-sectional side view of a portion of an electronic device with an illuminated touch sensor area having an image transport layer in accordance with an embodiment.

In an effort to create an illusion that the display content from pixel array 14P is located directly on the surface of device 10, layers 26 may optionally be provided with an image transport layer. FIG. 15 illustrates an embodiment where layers 26 of electronic device 10 include an image transport layer 140 interposed between pixel array 14P and the louver layer 36. Image transport layer 140 may be formed from a coherent fiber bundle or Anderson localization layer and may be invariant along the axis of light propagation (the Z axis in the example of FIG. 15). If desired, the fibers in layer 140 may be tilted with respect to the surface normal of the touch sensitive area at the exterior surface of device 10, similar to the tilt of the louver claddings in layer 36. As examples, the tilt of fibers with respect to the surface normal of the exterior housing surface may be at least 10°, at least 20°, at least 30°, at least 40°, at least 50°, at least 60°, less than 95° less than 85°, less than 75°, less than 65°, or less than 55°. The selection of the materials used in forming these fibers such as the color of the binding agent used to hold the fiber elements together and other portions of layer 140 may help provide layer 140 with a desired appearance (e.g., these structures may be configured to help impart a desired color, haze, opacity, reflectivity, etc.). Layer 140 may also help provide additional structural rigidity for layers 26 by providing additional thickness especially when the surrounding support layers such as layer 36 or 12W are relatively thin. Configured in this way, image transport layer 140 may provide enhanced structural integrity while minimizing loss of light traveling from pixels P to the external housing surface of device 10.

During operation, light emitted from pixels P passes vertically through layer 140 from input surface 142 to output surface 144 (e.g., due to the vertically oriented fibers in the fiber bundle forming layer 140 or the longitudinally invariant refractive index features in an Anderson localization material forming layer 140). The structures of FIG. 15 may, if desired, be located along a straight section of the peripheral edge of device 10 and/or along a rounded corner section of the peripheral edge of device 10. In some embodiments, output surface 144 may be curved (e.g., output surface 144 may exhibit a curved profile). For example, output surface 144 may have compound curvature when image transport layer 140 is being used at a corner of device 10.

The example of FIG. 15 in which there are no intervening layers between louver layer 36 and image transport layer 140 is merely illustrative. If desired, one or more of layers 84, 86, and 88 may be formed between layers 136 and 140 and/or between layers 12W and 36. If desired, layer 12W (e.g., an outer cover glass layer) may be completely omitted from device 10. In yet other arrangements, one or more additional diffusive layers, light extraction layers, textured layers, adhesive layers, cover layers, or other optical control layers may be formed within layers 26 to further improve the appearance of the illuminated display content when the display is on and to match the appearance of layers 26 to that of surrounding portions of housing 12 (e.g., portions of housing 12 that do not contain layers 26).

Figure 8:
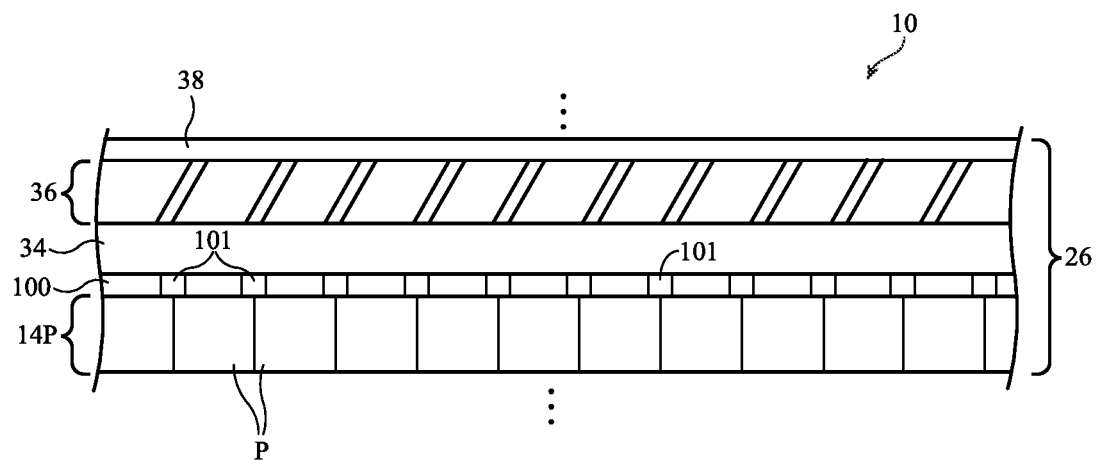
FIG. 8 is a cross-sectional side view of a portion of an electronic device with an illuminated touch sensor area having an opaque masking layer in accordance with an embodiment.
Figure 9:
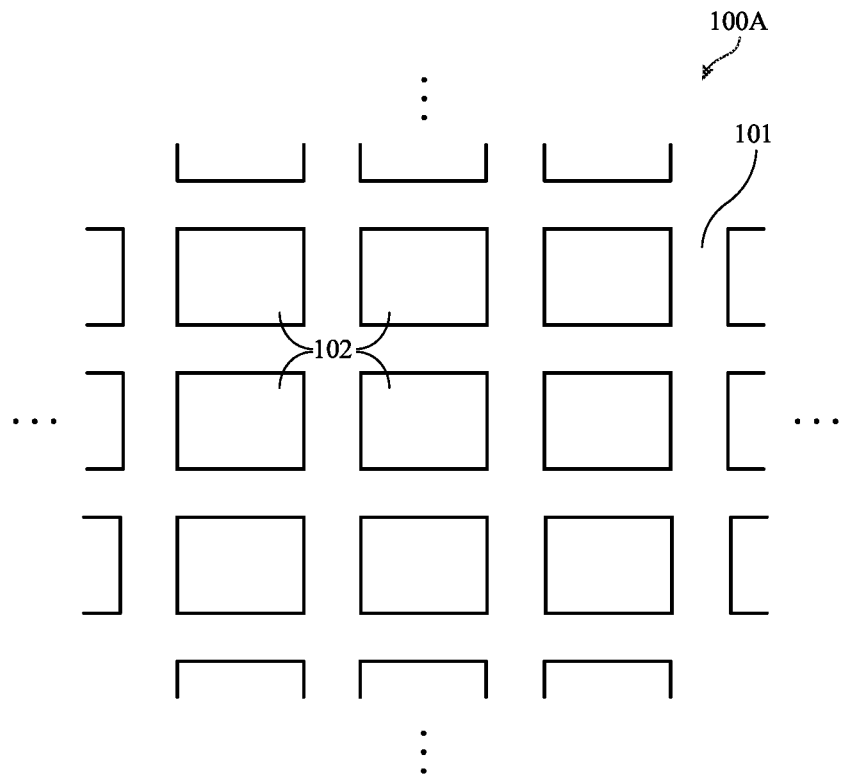
FIG. 9 is top (plan) view of an illustrative opaque masking layer having a checkerboard pattern in accordance with an embodiment.
Figure 10:
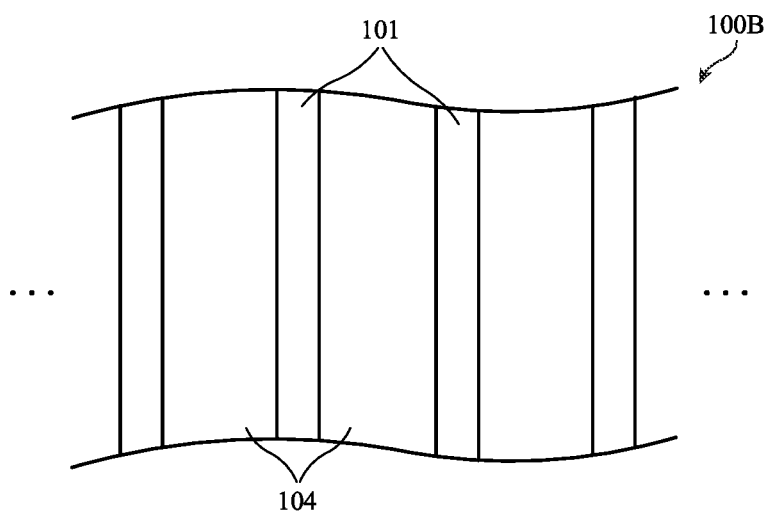
FIG. 10 is a top (plan) view of an illustrative opaque masking layer having a striped pattern in accordance with an embodiment.

Unlike conventional displays, display pixel array 14P of device 10 need not include a black matrix layer. A black matrix layer is typically used to preserve or enhance the black level of a display. Omitting such black matrix from pixel array 14P under touch sensor 34 can thus help to maintain a non-black appearance such as a neutral appearance (e.g., white, gray, or silver) or a non-neutral color (e.g., gold, red, blue, etc.). In some embodiments, a non-black masking layer such as masking layer 100 may be disposed on pixel array 14P (see, e.g., FIG. 8). As shown in FIG. 8, masking layer 100 may be interposed between pixel array 14P and touch sensor 34 (as an example). Masking layer 100 may include opaque portions such as opaque portions 101 that are aligned with non-emissive areas of pixel array 14P. Opaque portions 101 may form openings (or windows) that are aligned with and overlap the emissive regions of pixel array 14P. FIG. 9 shows in suitable arrangement where masking layer 100A forms a checkerboard pattern having openings 102 aligned with corresponding pixels in the display module. FIG. 10 shows another suitable arrangement where masking layer 100B includes opaque stripe portions 101 that form openings (or channels) 104 aligned with corresponding rows or columns of pixels in the display module. The patterns of FIGS. 9 and 10 are merely illustrative. In general, masking layer 100 may have opaque portions forming any regular or irregular pattern that at least partially overlap with the non-emissive areas of pixel array 14P.

As described above, masking layer 101 should not be black to help prevent pixel array 14P from appearing black when not illuminated (e.g., to provide the trackpad surface area of device 10 with an attractive appearance and an appearance that matches that of other portions of the exterior surface of device 10). To accomplish this, masking layer 101 may be formed using white opaque material such as titanium dioxide, titanium nitride, white polymer, white paint, or other suitable white material. Layer 101 might therefore sometimes be referred to as a non-black opaque masking layer such as a white matrix layer. Using a white masking layer 101 might be suitable for device 10 with a white exterior housing. If device 10 has an exterior housing of a different color (e.g., gray, black, gold, red, blue, green, etc.), masking layer 101 may be formed from opaque material having a color that helps match the outward appearance of surrounding portions of the device housing in terms of color, texture, reflectivity, haze, etc.

The light patterns produced by pixel array 14P may correspond to icons, reconfigurable button shapes, notifications, and/or other visual elements. Touch sensor 34 can receive input from these illuminated areas and from non-illuminated regions of the touch sensitive surface area. Consider, as an example, the arrangement of device 10 of FIG. 2. In this configuration, a portion of the exterior of device 10 forming a touch sensitive surface area may be overlapped by layers 26. During operation of device 10, the control circuitry in device 10 can use pixel array 14P to display illumination that creates illuminated touch controls 60 on the surface of device 10 (e.g., on layer 38 of layers 26). The illuminated touch controls can be created dynamically (e.g., by adjusting pixels P to produce a desired illumination pattern on layer 38). This allows the touch controls to be animated, to move in response to user input, to be adjusted to accommodate different modes of operation, to change as a function of which software application is running on device 10, etc. Because the illuminated touch controls can be adjusted (e.g., in shape, location, functionality, etc.), the illuminated touch controls may sometimes be referred to as reconfigurable touch controls, reconfigurable illuminated touch controls, reconfigurable illuminated touch sensor regions, etc.).

Figure 2:
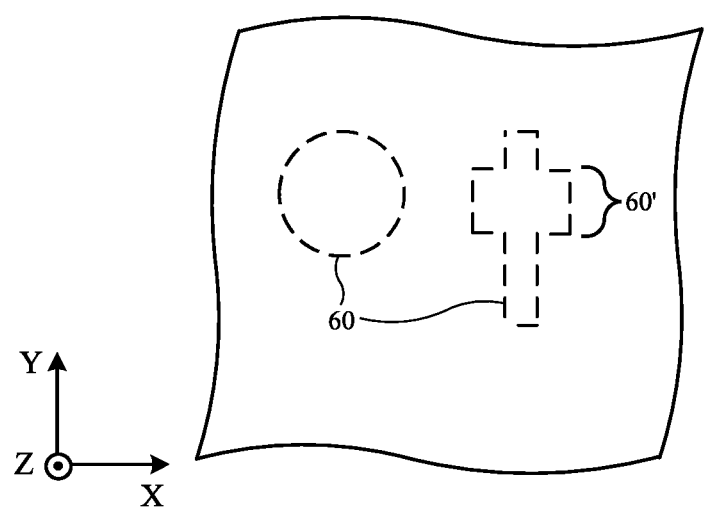
FIG. 2 is a top view of an illustrative portion of an electronic device showing how the electronic device may have a touch sensitive surface area overlapping a touch sensor with reconfigurable illumination and sensing areas in accordance with an embodiment.
Figure 3:
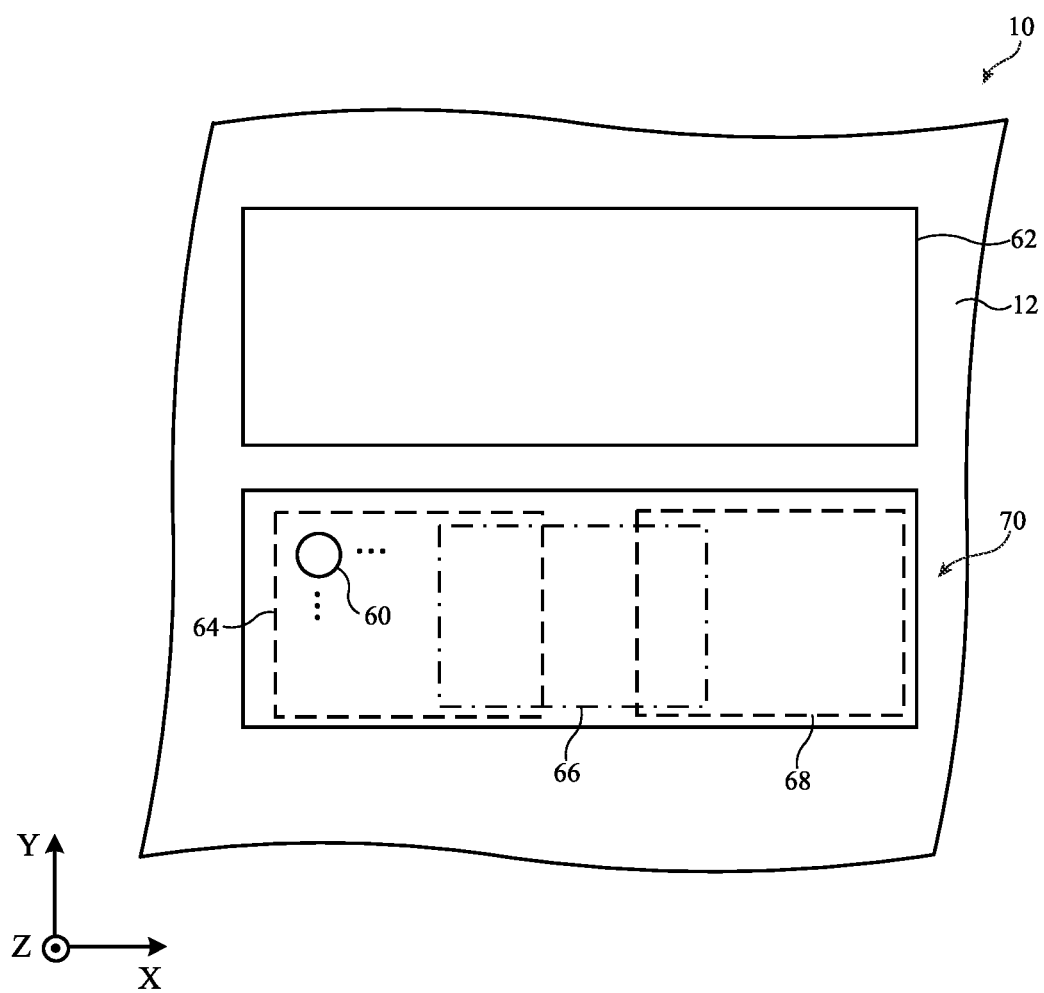
FIG. 3 is a top view of a housing for an electronic device such as a laptop computer having a touch sensor surface area with reconfigurable illumination and sensing areas in accordance with an embodiment.

In the example of FIG. 2, the right-hand illuminated touch control is a sliding button. As shown in FIG. 3, this touch control may include sliding button portion 60', which can be moved up and down parallel to the Y axis as a user drags finger 50 up and down parallel to the Y axis (as an example). In general, reconfigurable touch controls for device 10 may have any suitable fixed and/or adjustable visual appearance (e.g., different portions that can move in response to user touch input, portions that can change color, portions that can change from solid to blinking, areas that exhibit changeable brightness, fixed icon shapes, text labels, and/or other features). If desired, the overall layout and type of controls that are presented can also be adjusted depending on the mode of operation, based on user input, etc.

The portion of touch sensor 34 that is used in gathering touch input may be adjusted depending on the location and type of illuminated touch controls that are being presented. As an example, all portions of touch sensor 34 except those in the immediate vicinity of the touch controls may be deactivated to prevent inadvertent touch input or, in an alternative arrangement, all or some of the area of touch sensor 34 other than the portion of touch sensor 34 that is in the immediate vicinity of the touch controls may also remain active (e.g., to receive track pad input separate from touch input provided to the reconfigurable controls).

Consider, as an example, device 10 of FIG. 3. In the example of FIG. 3, device 10 is a laptop computer. FIG. 3 is a top view of the base housing portion of housing 12. Keyboard 62 and track pad 70 may be formed on the exposed top surface of the base housing, so that these input devices may be accessed by a user. For example, keyboard 62 may be a QWERTY keyboard containing alphanumeric keys (e.g., movable mechanical keys that each have movable key member that actuates a corresponding switch or other keys) that a user may use to enter text by typing. Keyboard 62 may include function keys, numeric keys, and/or other keyboard keys. Track pad 70, which may sometimes be referred to as a touch pad or touch controller, may have a two-dimensional capacitive touch sensor such as touch sensor 34 of FIG. 1 that forms a touch sensitive surface area on housing 12. Touch sensor 34 and the other layers in layers 26 of FIG. 1 (e.g., pixel array 14P, louver layer 36, etc.) may have any suitable shape. In the example of FIG. 3, layers 26 have a rectangular outline with a width that is equal to or nearly equal to the width of keyboard 62 (e.g., the width of the rectangular region that includes layers 26 may be equal to that of the width of keyboard 62 within +/−20%, within +/−10%, or within +/−5%). If desired, the touch area and pixel array 14P may also extend to include keyboard region 62, with the keyboard "key elements" being created dynamically by pixel array 14P and key presses being detected by the touch sensor.

During operation, illuminated touch controls 60 may be displayed on some or all of layers 26 (e.g., in some or all of the surface area of track pad 70). Track pad 70 may or may not be visible to the user. Touch sensor 34 may likewise be configured to be active over some or all of the area consumed by track pad 70. If desired, the touch and/or illumination functions of layers 26 in track pad 70 may be configured differently in different modes of operation.

For example, in a first mode of operation, touch sensor 34 may be configured to sense touch input over the entire surface of track pad 70 (e.g., all capacitive touch sensor electrodes in sensor 34 may be active and used in monitoring for touch input), whereas in other modes of operation, only a subset of the surface of track pad 70 is active and remaining portions of the surface of track pad 70 are inactive. For example, in a second mode of operation, track pad 70 may be active in left area 64 but not in right area 68. In this second mode of operation, an outline of the left area 64 might be displayed on some or all of layers 26 and a user may supply touch input to area 64 (e.g., track pad input to control a cursor on a display in device 10, etc.), but any touch input to area 68 on the right side of track pad 70 will be ignored by device 10. Similarly, in an illustrative third mode of operation, track pad 70 may be configured so that area 68 on the right of track pad 70 is active, whereas area 64 on the left of track pad 70 is inactive. In this third mode, an outline of the right area 68 might be displayed on some or all of layers 26 and the user may supply touch input to area 68. Any touch input on the left of track pad 70 (e.g., in area 64) will be ignored. One or more additional modes may be supported, if desired. For example, a fourth mode of operation may be supported in which only center portion 66 of track pad 70 is active and remaining portions to the left and right of this central area are inactive. In this fourth mode, an outline of the center area 66 might be displayed on some or all of layers 26 and the user may supply touch input to area 66.

Selectable illuminated options (e.g., buttons, sliders, knobs, and/or other reconfigurable illuminated touch controls) may be displayed in the active area of track pad 70. If desired, portions of track pad 70 that might otherwise be inactive (e.g., left area 64 in the illustrative third mode of operation) may be active so long as these portions directly coincide with an illuminated touch control. For example, area 64 may be inactive in the third mode except where a selectable set of illuminated icons are located. Selectable buttons may also be present within the active area of track pad 70 that is being used to gather track pad input such as cursor positioning input that is not generally associated with illuminated controls.

As the foregoing example demonstrates, the active touch sensing regions and illuminated controls of the touch sensitive surface area of device 10 that is covered with layers 26 (e.g., track pad 70 in the example of FIG. 3) may be dynamically reconfigured. Different illuminated touch controls and/or active touch areas may be present in different contexts. For example, different patterns of illuminated touch controls and active touch areas may be used in response to the use of different software programs (e.g., different applications running on the control circuitry of device 10), may be used in response to changing operating modes within a software program (e.g., transitioning between a review mode and an edit mode in a drawing program or word processing program, etc.), may be used in response to the position and/or relative orientation of different portions of housing 12 (e.g., depending on whether the lid of a laptop computer is open or closed, may be used depending on whether a tablet computer is operated in portrait or landscape mode, etc.), and/or may be used in response to other suitable conditions. The example of FIG. 3 in which track pad 70 is reconfigurable between several different operating modes is illustrative.

Figure 4:
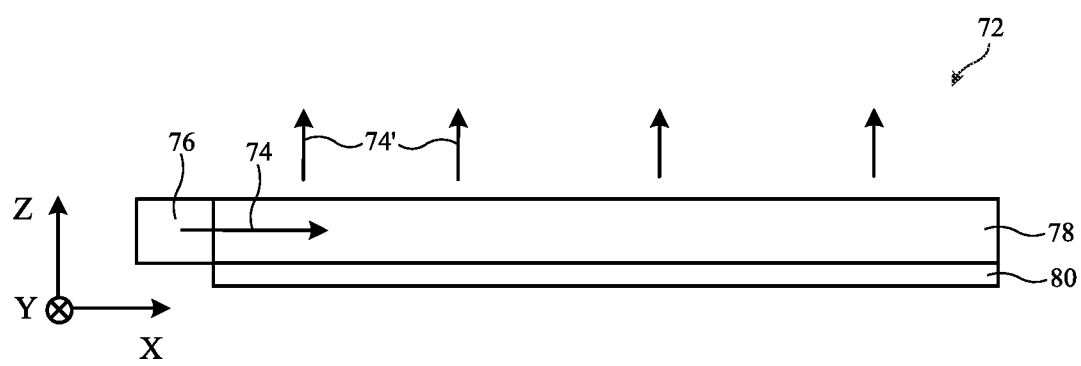
FIGS. 4 and 5 are side views of illustrative backlights in accordance with embodiments.
Figure 5:
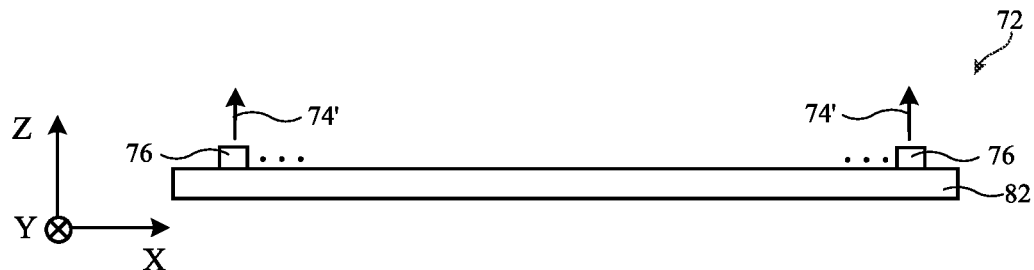

To produce backlight illumination for pixels P in pixel array 14P, pixel array 14P may be provided with a backlight unit (sometimes referred to as a backlight or backlight structures). Illustrative backlight units for device 10 are shown in FIGS. 4 and 5. In the example of FIG. 4, backlight 72 has a light guide layer 78. Light guide layer 78 may sometimes be referred to as a waveguide. Light 74 is emitted into the edge of light guide layer 78 by light source 76. Light guide layer 78 may be a layer of polymer (e.g., a flexible polymer film or rigid polymer plate), glass, or other transparent substrates capable of guiding light via the principle of total internal reflection. Light source 76 may include one or more light-emitting devices such as laser diodes, light-emitting diodes, micro LEDs, micro-projectors, microelectromechanical system (MEMS)-based displays, digital micromirror device (DMD) displays, liquid crystal on silicon (LCoS) displays, computer-generated holography (CGH) displays, or spatial light modulator displays that can directly display content using the light guide layer 78. These light-emitting devices may be mounted along one or more edges of light guide layer 78. Light source 76 may emit infrared, visible, and/or ultraviolet light. This light (light 74) may travel laterally within light guide layer 78 in accordance with the principle of total internal reflection. Light guide layer 78 may include light-scattering structures that scatter some of this light (e.g., light 74' in the example of FIG. 4) outwardly to serve as backlight for pixel array 14P or for directly outputting display content. The light-scattering structures may include bumps, ridges, and/or other protrusions on one or both surfaces of layer 78, may include pits, grooves, and/or other recesses on one or both surfaces of layer 78, may include embedded light-scattering particles such as titanium dioxide particles or other inorganic dielectric particles having a refractive index that varies from that of layer 78, and/or may include embedded fluid-filled bubbles. If desired, a reflector such as reflector 80 (e.g., a polymer film with a stack of alternating-refractive-index layers that form a thin-film interference filter mirror, a reflective layer of white ink, and/or other reflective materials) may be included in backlight 72 to help recycle scattered light that has been scattered out of layer 78 in the downwards (−Z) direction.

Figure 12:
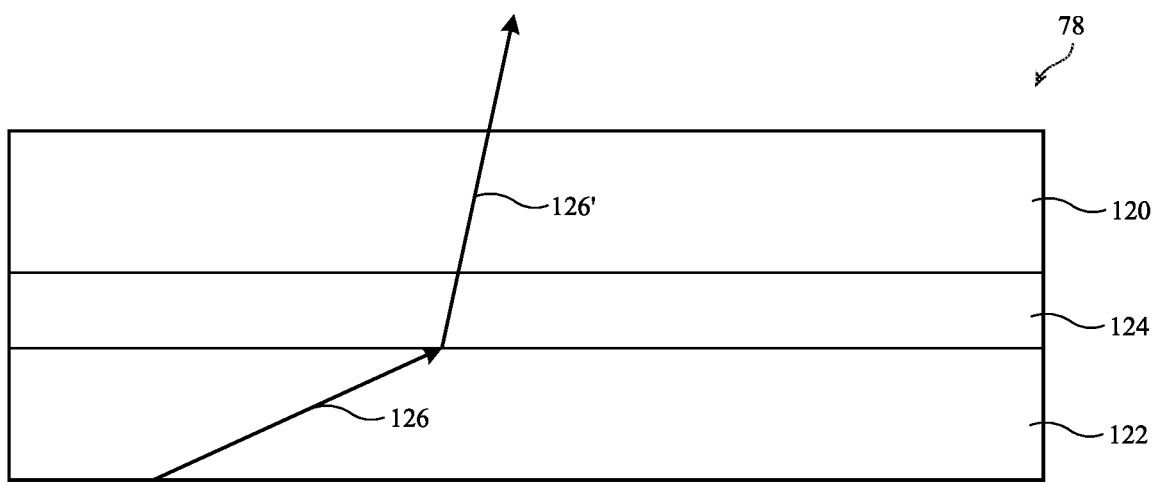
FIG. 12 is a cross-sectional side view of an illustrative light guide layer having holographic optical elements in accordance with an embodiment.

If desired, light guide (waveguide) layer 78 may optionally include holographic (diffractive) optical elements. FIG. 12 shows a cross-sectional side view of light guide layer 78 having holographic optical element 124 interposed between substrates 120 and 122. Holographic optical element 124 may include holographic media such as photopolymers, gelatin such as dichromated gelatin, silver halides, holographic polymer dispersed liquid crystal, or other suitable volume holographic media. Holographic recordings (e.g., holographic phase gratings sometimes referred to herein as holograms) may be stored in the holographic media. The holographic media may sometimes be referred to herein as grating media. A holographic recording may be stored as an optical interference pattern (e.g., alternating regions of different indices of refraction) within a photosensitive optical material such as the holographic media. The optical interference pattern may create a holographic phase grating that, when illuminated with a given light source, diffracts light to create a three-dimensional reconstruction of the holographic recording. The holographic phase grating may be a non-switchable diffractive grating that is encoded with a permanent interference pattern or may be a switchable diffractive grating in which the diffracted light can be modulated by controlling an electric field applied to the holographic recording medium. Multiple holographic phase gratings (holograms) may be recorded within (e.g., superimposed within) the same volume of grating medium if desired. The holographic phase gratings may be, for example, volume holograms in the grating medium.

Holographic optical element 124 may include a set of diffractive gratings configured to diffract light 126 traveling through light guide layer 78 out of light guide layer 78 towards a user's eye, as shown by exiting light ray 126'. In this example, holographic optical element 124 may include transmissive gratings. This is merely illustrative. Light guide layer 78 may include reflective gratings and/or transmissive gratings.

Figure 13:
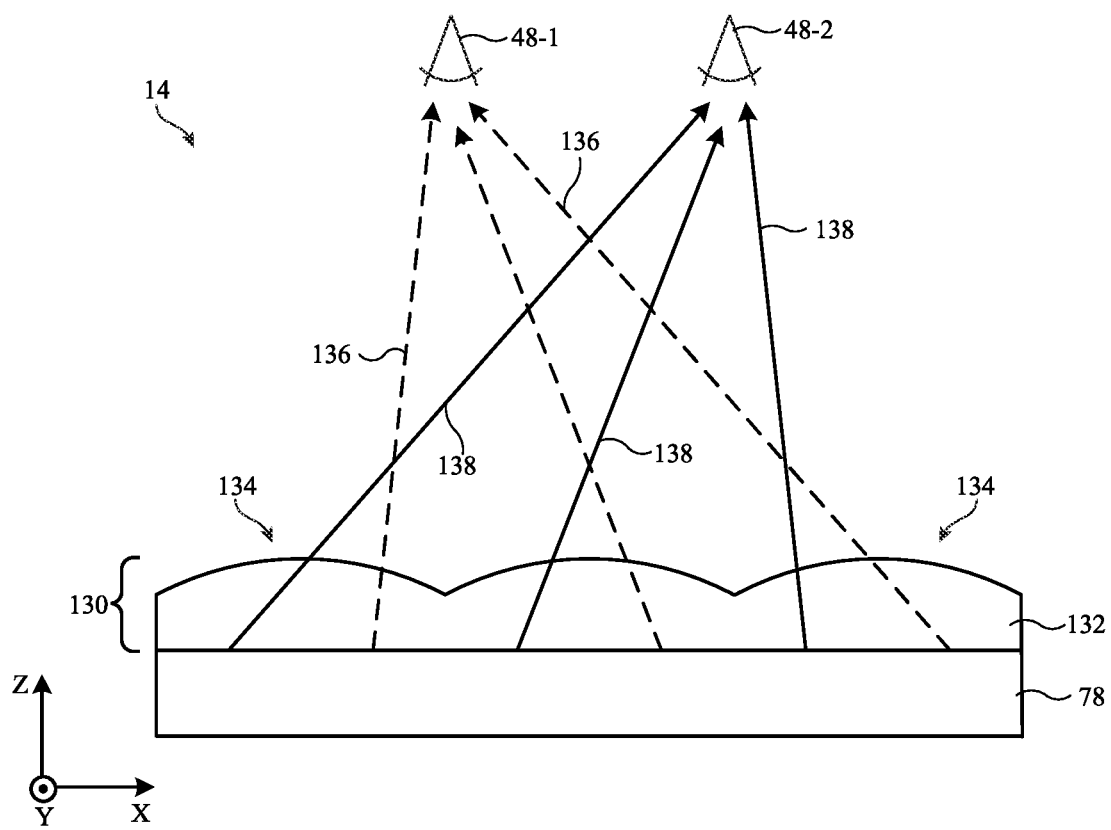
FIG. 13 is a cross-sectional side view of an illustrative lenticular lens film disposed on a light guide layer in accordance with an embodiment.

In some embodiments, additional optical elements such as lenticular films may be disposed on top of light guide layer 78 (see, e.g., FIG. 13). As shown in FIG. 13, lenticular lens film 130 (sometimes referred to as a stereoscopic lens film, light redirecting film, or lens film) may be formed over light guide layer 78. Lenticular lens film 130 includes lenses 134 and a base film portion 132 (e.g., a planar film portion to which lenses 134 are attached). Lenses 134 may be lenticular lenses that extend along respective longitudinal axes (e.g., axes that extend into the page parallel to the Y-axis). Lenses 134 may be referred to as lenticular elements, lenticular lenses, optical elements, etc.

The lenticular lenses may redirect light emitted from light guiding layer 78 or other overlapping display pixels (see, e.g., display pixels P of FIG. 1 or FIG. 6) to enable stereoscopic viewing of the display pixel array. Consider the example of the display being viewed by a viewer with a first eye (e.g., a right eye) 48-1 and a second eye (e.g., a left eye) 48-2. Light 138 from light guide layer 78 is directed by the lenticular lens film 130 towards left eye 48-2, whereas light 136 from light guide layer 78 is directed by the lenticular lens film 130 towards right eye 48-1. Configured in this way, the viewer's right eye 48-1 and left eye 48-2 may see slightly different images projected from the display. Consequently, the viewer may perceive the received images as a single three-dimensional image floating above the surface of the device housing.

Figure 14:
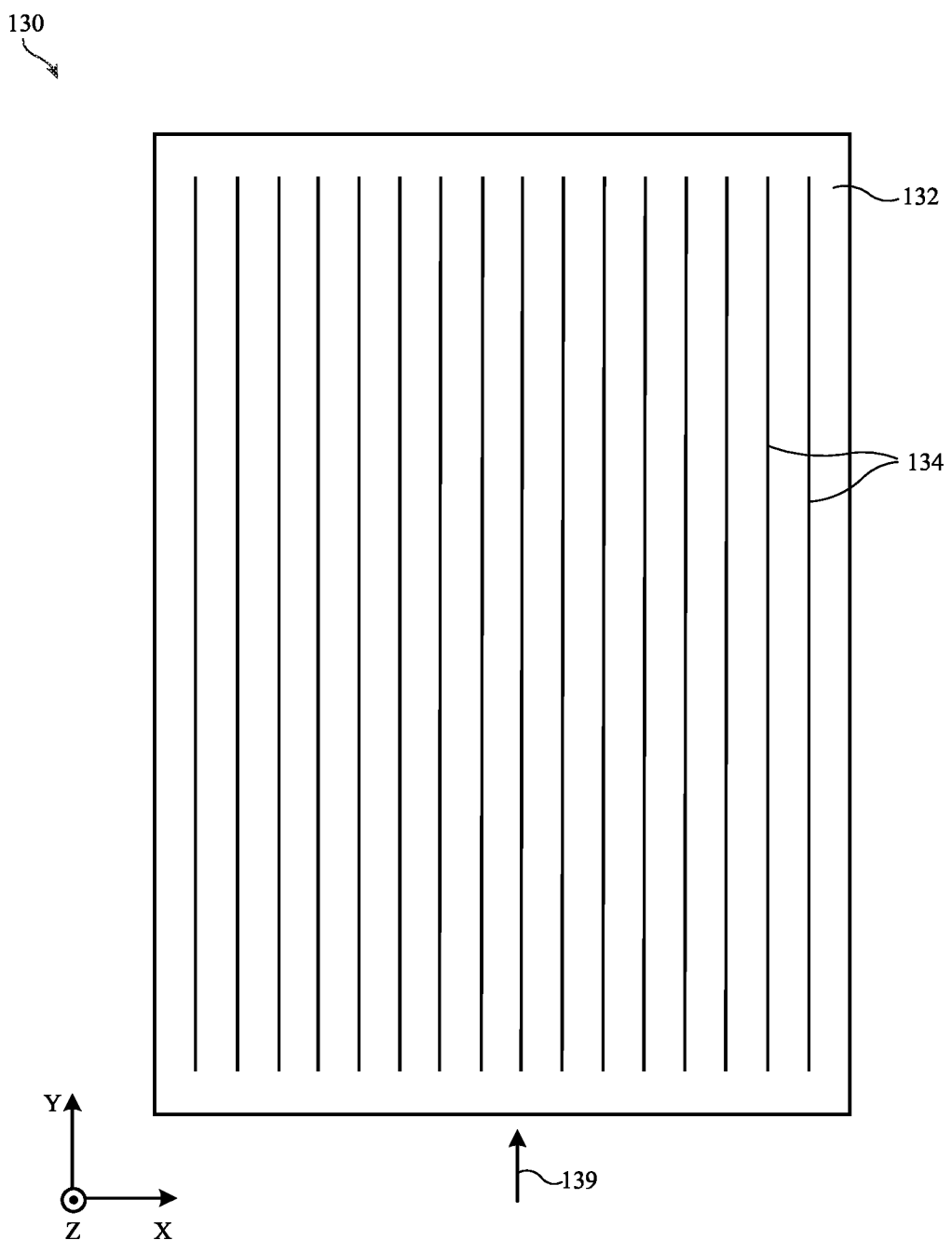
FIG. 14 is a top (plan) view of a lenticular lens film of the type shown in FIG. 13 in accordance with an embodiment.

FIG. 14 is a top view of illustrative lenticular lens film 132 of the type shown in FIG. 13. As shown in FIG. 14, elongated lenses 134 extend across the display parallel to the Y-axis. For example, the cross-sectional side view of FIG. 13 may be taken looking in direction 139. Lens film 130 may include any desired number of lenticular lenses 134 (e.g., more than 10, more than 100, more than 1,000, more than 10,000, etc.). In the example of FIG. 14, the lenticular lenses 134 extend perpendicular to the upper and lower edge of the display panel. This arrangement is merely illustrative, and the lenticular lenses may instead extend at a non-zero, non-perpendicular angle (e.g., diagonally) relative to the display panel if desired. With the arrangement of FIG. 14, the lenticular lenses 134 split the display into distinct viewing zones along the X-axis.

In the example of FIG. 5, backlight 72 is a direct-lit backlight having a two-dimensional array of light sources 76 (e.g., a two-dimensional array of light-emitting diodes and/or lasers) that produce backlight 74' directly. Light sources 76 of FIG. 5 may be mounted on a substrate such as printed circuit 82 (e.g., a flexible printed circuit formed from a bendable sheet of polyimide or other flexible layer of polymer or a rigid printed circuit formed from fiberglass-filled epoxy or other rigid printed circuit board substrate material). Light sources 76 of FIG. 5 may, if desired, be individually controlled (e.g., so that backlight 74' is only produced in areas of pixel array 14P where this backlight is being used to illuminate reconfigurable touch controls).

Backlights such as backlights 72 of FIGS. 4 and 5 may be used to backlight arrays of pixels P in pixel array 14P such as liquid crystal pixel arrays. A liquid crystal pixel array may be formed from a liquid crystal layer sandwiched between a thin-film transistor layer and a color filter layer. The thin-film transistor layer may have a two-dimensional array of individually controlled pixel circuits each of which has electrodes to control an associated pixel-sized portion of the liquid crystal layer. Polarizers may be formed on the upper and lower surfaces of the pixel array (e.g., so that the color filter layer and thin-film transistor layer are sandwiched between the polarizers). With this arrangement and other suitable liquid crystal pixel array arrangements, each pixel may be individually adjusted to control its light transmission. By adjusting the transmission of each liquid crystal pixel, a desired illumination pattern for the reconfigurable touch controls on the touch sensitive surface area can be produced. In general, any suitable type of adjustable pixels may be used in forming a backlit pixel array. The use of a two-dimensional array of liquid crystal pixels to form pixel array 14P is illustrative.

If desired, backlight 72 can be omitted by providing pixel array 14P with an array of light-emitting pixels P. Pixels P may be, for example, light sources such as laser diodes or light-emitting diodes. Light-emitting diode pixels may each have a light-emitting diode such as a thin-film organic light-emitting diode or a light-emitting diode formed from a crystalline semiconductor die. An array of pixels P for providing device 10 with the ability to display images may also be implemented using other display technologies. For example, pixel array 14P may be implemented using a scanning display design such as a scanning laser, may be implemented using a display projector (e.g., a projection source such as a digital light projector, a liquid-crystal-on silicon projector, or other projector).

Figure 6:
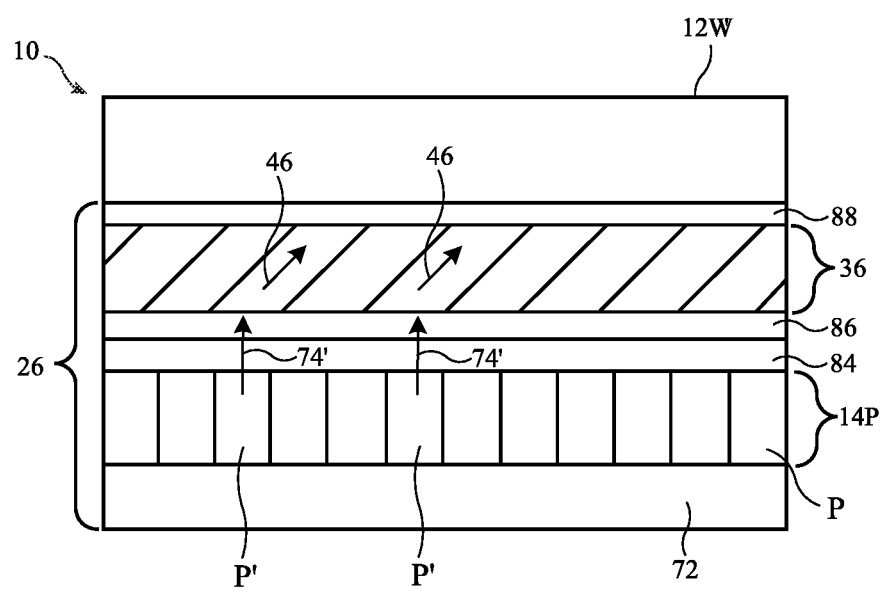
FIG. 6 is a cross-sectional side view of a portion of an electronic device with an illuminated touch sensor area in accordance with an embodiment.

In some configurations, ultraviolet backlight is produced by backlight 72 (e.g., when light sources 76 of FIG. 4 or FIG. 5 are ultraviolet light sources such as ultraviolet lasers or light-emitting diodes). An example of this type of configuration is shown in FIG. 6. Backlight 72 of FIG. 6 produces ultraviolet light that passes the pixels P of pixel array 14P that have been placed into a fully or partially transparent state (see, e.g., partially or fully transparent pixels P' of FIG. 6). After passing through selected pixels P' in pixel array 14P, ultraviolet light 74' may pass through optional filter 84. Filter 84 may be a thin-film interference filter that is formed from a stack of dielectric layers of alternating refractive index and/or other dielectric layers with refractive index values and thicknesses configured to provide filer 84 with desired spectral characteristics for absorption, reflection, and transmission. In an illustrative arrangement, filter 84 is configured to pass ultraviolet light 74' while absorbing and/or reflecting visible light. The optical characteristics of filter 84 may be used in adjusting the outward appearance of device 10 in the touch sensing surface area of housing 12 (e.g., the area of housing 12 overlapped by layer 12W and layers 26). If desired, pixel array 14P may be formed from an array of ultraviolet organic light-emitting diodes or ultraviolet crystalline light-emitting diode dies that are tuned to emit ultraviolet light. In this type of arrangement, ultraviolet light from pixel array 14P need not pass through adjustable-transmission pixels and backlight 72 may be omitted.

Layers 26 may include louver layer 36 and optional layers above and below louver layer 36 such as layers 86 and 88. Touch sensor 34 may be located in layer 86 or layer 88. Layer 88 (or, in some embodiments, layer 86 or even layer 12W) may also include a photoluminescent layer or material such as a phosphor layer or other layer of material that exhibits fluorescence when exposed to ultraviolet light 74'. The photoluminescent layer may be located above or below touch sensor 34. In some embodiments, louver layer 36 may be omitted. Configurations in which louver layer 36 is present may sometimes be described as an example.

If desired, texture, light-scattering particles, colorant (e.g., dye and/or pigment), and/or other materials may be incorporated into layers 26. For example, layer 36, and/or other layers over array 14P (e.g., layer 86 and/or layer 12W) may be provided with materials that absorb and/or reflect visible light, thereby adjusting the color, texture, and other visual attributes of device 10 (e.g., so that the touch sensitive surface of device 10 that is covered by layers 26 has an outward appearance that matches that of surrounding portions of housing 12 in color, texture, reflectivity, etc.).

In configurations in which layer 88 includes a photoluminescent layer that fluoresces under ultraviolet illumination, the photoluminescent layer may be covered by a filter coating that blocks ultraviolet ambient light while passing visible light. The filter may be a thin-film interference filter that is formed from a stack of dielectric layers of alternating refractive index and/or other dielectric layers with refractive index values and thicknesses configured to provide the filter with desired spectral characteristics for absorption, reflection, and transmission. In an illustrative arrangement, the filter of layer 88 is configured to block ultraviolet light such as ultraviolet ambient light, so that ultraviolet ambient light does not pass through the filter to the photoluminescent layer. This prevents the photoluminescent layer from fluorescing due to exposure from ambient light. The filter of layer 88 may be configured to pass some or all visible light, so that layer 36 may be viewed by a user (e.g., so that colored structures, structures with desired haze, and/or structures with other desired optical characteristics that are formed in layer 36 and/or other portions of layers 26 may be viewed from the exterior of device 10).

In general, any suitable portions of layers 26 may be provided with desired visible attributes such as a desired color, desired texture, desired haze, etc.). As an example, in scenarios in which the photoluminescent layer is located in layer 88, color, texture, haze, and/or other desired properties may be imparted to portions of layer 36, layer 86, and/or layer 84, which are visible through layer 88. Layer 88 (e.g., the filter coating on the photoluminescent layer in layer 88) may also be provided with a desired color, texture, and/or other desired visual properties. These visual properties of layers 26 may be selected so that layers 26 have an appearance that matches that of surrounding portions of housing 12 (e.g., portions of housing 12 that do not contain layers 26).

Housing 12 may be configured to form a housing for a laptop computer (e.g., in a scenario in which layer 26 overlap a reconfigurable trackpad and/or a reconfigurable keyboard), may be configured to form a housing for a cellular telephone, a housing for other portable devices, a housing for a removable case, cover, or folio, a housing for a battery case for holding earbuds or other accessories, housing structures for other electrical components, and/or other structures for electronic devices.

During operation, ultraviolet light that passes from backlight 72 through adjustable-transmission pixels in array 14P or that is emitted directly by ultraviolet-light-emitting diodes or lasers in pixel array 14P in a scenario in which backlight 72 is omitted reaches the photoluminescent layer and generates visible light. In an illustrative embodiment, layer 88 contains the photoluminescent layer and light 46 (e.g., ultraviolet light 74' that is passing through optional louver layer 36) strikes the photoluminescent layer and creates corresponding visible light (e.g., white visible light, as an example). The pattern of ultraviolet light that strikes the photoluminescent layer determines the corresponding pattern of visible light that is created. As with the other illustrative arrangements for layers 26, the pattern of visible light that is created may correspond to a notification, a reconfigurable touch control, or other visual output.

In arrangements in which the photoluminescent layer is located in layer 88, the illuminated pattern that is created in the photoluminescent layer will appear close to the outermost surface of device 10. Layer 36 in this type of configuration may be transparent to ultraviolet light so that the ultraviolet light can reach the photoluminescent layer. In arrangements in which the photoluminescent layer is located in layer 86, visible light from the photoluminescent layer that is produced when ultraviolet light strikes the photoluminescent layer may pass through layer 36.

The desired appearance that is produced for layers 26 may include a desired neutral or non-neutral color, a desired reflectivity, a desired opacity, a desired haze, etc. This desired appearance may match the appearance of surrounding portions of device 10 (e.g., adjacent portions of housing 12 that do not overlap layers 26 may have a color, reflectivity, haze, texture, and/or other attributes that are the same as or nearly the same as the corresponding color, reflectivity, haze, texture, and/or other attributes of the portion of device 10 overlapping layers 26).

Optional internal supporting layer(s) and/or external supporting structures such as optional outer layer 12W may overlap layer 88. As described in connection with FIG. 1, layer 12W may be a housing wall in housing 12 or other structural layer that is used to support layers 26. If desired, layer 12W may have a first area that coincides with the touch sensitive surface area of layers 26 and may have a second area that is not touch sensitive (e.g., layer 12W may overlap the top of a laptop base housing so that a given portion of layer 12W overlaps a trackpad region and a remaining portion does not overlap the trackpad region). Layer 12W may be formed from polymer, glass, crystalline material such as sapphire, and/or other suitable materials and may be clear, may be partially transparent, may have a neutral color (e.g., gray), may have a non-neutral color (e.g., gold, red, blue, green, etc.), may or may not have texture and/or light-scattering particles that create haze, and/or may have other suitable attributes that help provide the exterior of device 10 that layers 26 with a desired appearance.

The outward appearance of device 10 over layers 26 may also be adjusted by providing layer 36, and/or other layers 26 with desired optical properties (e.g., by providing the louver cores and/or claddings with light-scattering particles, dye, pigment, and/or other colorant, surface texture, one or more optional coating layers with desired optical characteristics, etc.). Touch sensor functionality may be included in layers 26 of FIG. 6, if desired (e.g., by incorporating touch sensor 34 of FIG. 1 into layers 26 above or below louver layer 36). In this way, the appearance of layer 12W and/or the layers under layer 12W such as louver layer 36 and/or other layers 26 may create a desired visual appearance for device 10. For example, layers 26 may be sufficiently transparent to allow light 46 to exit device 10 and thereby form notifications or reconfigurable illuminated touch controls visible on the surface of layers 26, while being provided with an attractive appearance (e.g., a desired non-neutral color or a partially transparent neutral shade such as light or dark grey) where internal illumination from layers 26 is not present.

In yet other embodiments, layer 88 may include one or more layers of colloidal semiconductor nanocrystalline particles, sometimes referred to as quantum dots. Similar to other photoluminescent materials, quantum dots can respond to short wavelength illumination in the ultraviolet or near-ultraviolet range. When a quantum dot is illuminated by ultraviolet light, an electron in the quantum dot jumps from the valence band to the conductance band. The excited electron will drop back to the valence band, releasing its energy via an emission of light. Depending on their atomic structure, size, and/or geometry, a quantum dot particle can, when excited using ultraviolet (or near-UV) light, emit red, green or blue light. For example, smaller quantum dots are configured to emit blue (bluish) light, whereas larger quantum dots are configured to emit red (reddish) light. Medium sized quantum dots are configured to emit green (greenish) light. Quantum dots are small enough such that layer 88 would appear transparent to the human eye and their resulting illumination would appear near or directly on the surface of the device housing.

Figure 11:
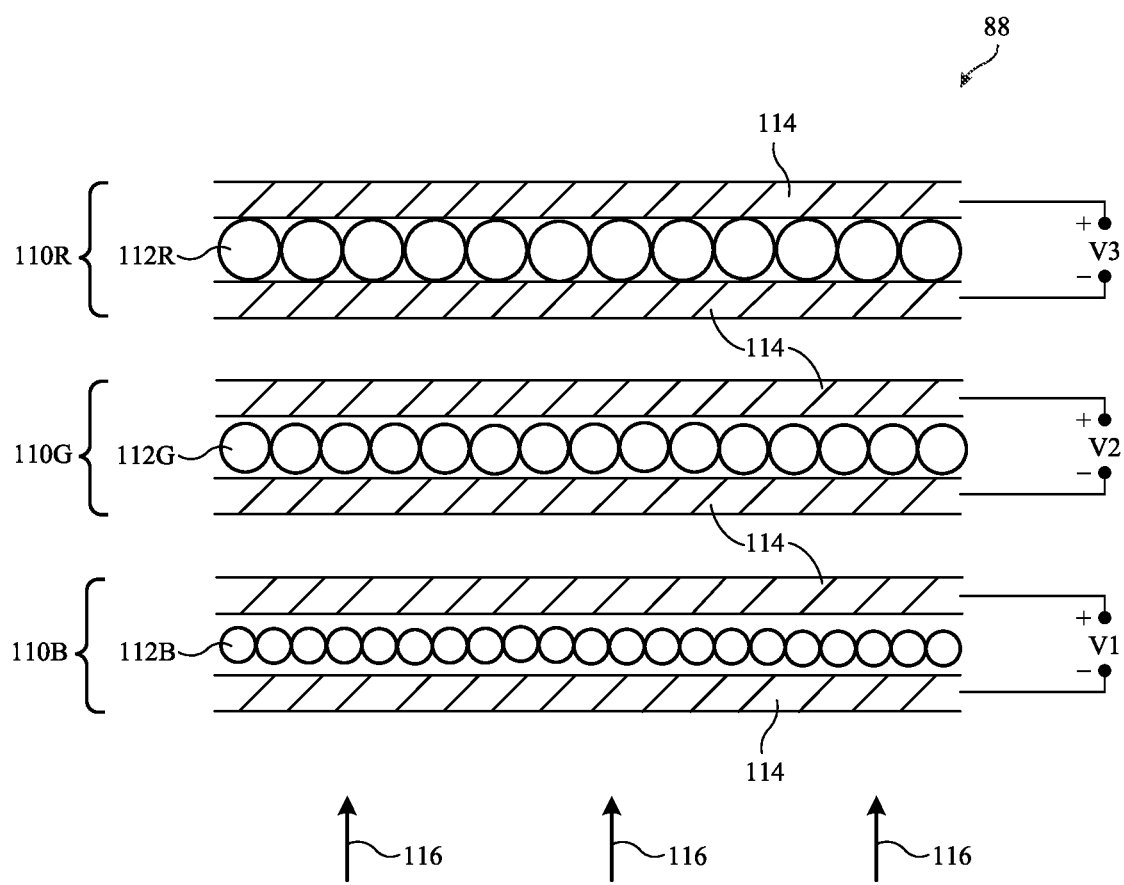
FIG. 11 is a cross-sectional side view of illustrative adjustable photoluminescent layers in accordance with an embodiment.

In general, photoluminescent material such as phosphors and quantum dots react equally to a given excitation of ultraviolet light (or near-UV light). Thus, using a single illumination source to excite the photoluminescent material in layer 88 would generate a single color or a constant mix of several colors. FIG. 11 illustrates another embodiment of layer 88 that includes multiple layers of quantum dots configured to generate a full color RGB image from a single illumination source. As shown in FIG. 11, layer 88 may include a first quantum dot layer 110B having blue quantum dots 112B disposed between adjacent conductive layers 114, a second quantum dot layer 110G having green quantum dots 112G disposed between adjacent conductive layers 114, and a third quantum dot layer 110R having red quantum dots 112R disposed between adjacent conductive layers 114.

Quantum dots can be quenched using an applied electric field, which causes the quantum dots to ignore the incoming illumination 116 (e.g., application of an electric field can prevent the quenched quantum dots from responding to incoming ultraviolet excitation light source 116). In FIG. 11, red quantum dots 112B can be selectively quenched by applying a non-zero voltage V1 across conductive plates 114 to generate an electric field in layer 110B; green quantum dots 112G can be selectively quenched by applying a non-zero voltage V2 across conductive plates 114 to generate an electric field in layer 110G; and red quantum dots 112R can be selectively quenched by applying a non-zero voltage V3 across conductive plates 114 to generate an electric field in layer 110R. When none of the layers are quenched, all three layers will be excited to generate white light. One or more of layers 110B, 110G, and 110R can be sequentially quenched to generate a full color RBG image using a single illumination light source (e.g., ultraviolet light). As an example, quenching only layers 110G and 110R will allow layer 110B to emit blue light. As another example, quenching only layers 110R and 110B will allow layer 110G to emit green light. As yet another example, quenching only layer 110B will allow layers 110G and 110R to collectively emit yellow light.

Figure 7:
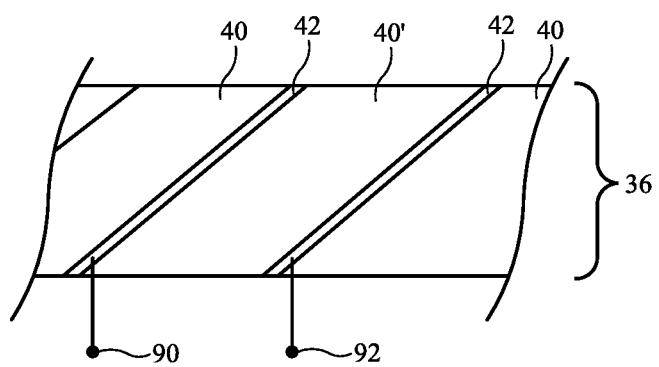
FIG. 7 is a cross-sectional side view of an adjustable louver structure in a louver layer in accordance with an embodiment.

If desired, the louvers of louver layer 36 may be adjustable. As shown in FIG. 7, for example, louver claddings 42 (or coatings on portions of claddings 42) may form electrodes that are used to apply adjustable electric fields across louver cores 40. In the example of FIG. 7, core 40' has a pair of associated electrodes that are electrically connected to terminals 90 and 92, respectively. Louver cores such as core 40' (and/or some or all of claddings 42) may contain a material that is adjusted in response to changed electric field strength (e.g., guest-host liquid crystal material, electrophoretic ink, polymer dispersed liquid crystal material, electrochromic material, and/or other material that exhibits adjustable optical properties such as an adjustable absorption spectrum, an adjustable transmission spectrum, and/or an adjustable reflection spectrum that varies as a function of applied electric field and/or an adjustable haze and/or an adjustable polarization). By providing the core material and/or cladding material of layer 36 with material(s) having adjustable optical properties, the appearance of layer 36 and therefore the exterior of device 10 overlapping layers 26 may be adjusted (e.g., to exhibit a desired neutral or non-neutral color, to exhibit a desired haze, to exhibit a desired transmission, etc.). Adjustable louvers in louver layer 36 may be adjusted separately from adjustments made to pixels P in pixel array 14P and/or louver adjustments may be made in place of adjustments to pixels P (e.g., in arrangements in which the electrodes in the louvers are pixelated). As an example, pixel array 14P may be omitted and louvers 36 may contain an array of adjustable louvers that serve as adjustable pixels. The adjustable pixels of louvers 36 can be adjusted to create desired patterns of illumination such as illumination patterns associated with reconfigurable touch controls. Backlight illumination for adjustable louvers may be provided by backlight 72 (see, e.g., FIGS. 4 and 5).

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

What is claimed is:

1. An electronic device having a touch sensitive surface area, comprising:
    a housing;
    a touch sensor overlapped by the touch sensitive surface area;
    layers including a louver layer overlapping the touch sensor; and
    a pixel array configured to produce light that passes through the louver layer and creates illuminated reconfigurable touch controls on the touch sensitive surface area, wherein the layers are configured to provide a portion of the touch sensitive surface area in which no light from the pixel array is present with an appearance matched in color to an appearance of an adjacent surface of the housing.

2. The electronic device defined in claim 1 wherein the layers have a haze of at least 10%.

3. The electronic device defined in claim 2 wherein the layers are partially transparent and wherein the portion of the touch sensitive surface area in which no light from the pixel area is present has a gray appearance.

4. The electronic device defined in claim 2, wherein the layers are partially transparent and wherein the portion of the touch sensitive area in which no light from the pixel array is present has a non-neutral color matching a non-neutral color of the adjacent surface of the housing.

5. The electronic device defined in claim 4 wherein the adjacent surface of the housing and the touch sensitive surface area have matched textures.

6. The electronic device defined in claim 2 wherein the layers are partially transparent and wherein the portion of the touch sensitive area in which no light from the pixel array is present has a non-neutral color.

7. The electronic device defined in claim 2 wherein the touch sensitive surface area is characterized by a surface normal, wherein the louvers each have a louver core surrounded by louver claddings, and wherein the louver cores are tilted at a non-zero angle with respect to the surface normal.

8. The electronic device defined in claim 7, wherein the louver layer is configured to provide the portion of the touch sensitive surface with a gray appearance matched in color and texture to the appearance of the adjacent surface of the housing.

9. The electronic device defined in claim 2, wherein the louver layer is configured to provide the portion of the touch sensitive surface with a non-neutral color.

10. The electronic device defined in claim 2, wherein the louver layer is configured to provide the portion of the touch sensitive surface with a neutral color.

11. The electronic device defined in claim 10 wherein the neutral color is gray and wherein the louver layer is configured to provide the portion of the touch sensitive surface with a gray color.

12. The electronic device defined in claim 10 wherein the neutral color is white and wherein the louver layer is configured to provide the portion of the touch sensitive surface with a white color.

13. The electronic device defined in claim 1 wherein the louver layer has a haze of at least 5%.

14. The electronic device defined in claim 1 wherein the layers have a transmission of 10-90%.

15. The electronic device defined in claim 1 wherein the pixel array comprises pixels selected from the group consisting of organic light-emitting diode pixels and crystalline semiconductor light-emitting diode pixels.

16. The electronic device defined in claim 1 wherein the pixel array comprises a thin film transistor liquid crystal display, the electronic device further comprising a backlight that provides illumination for the pixel array.

17. The electronic device defined in claim 1 wherein the pixel array comprises a scanning laser.

18. The electronic device defined in claim 1 wherein the pixel array comprises a projection source.

19. The electronic device defined in claim 18 wherein the projection source comprises a projection source selected from the group consisting of a digital light projector and a liquid-crystal-on silicon display.

20. The electronic device defined in claim 1 wherein the pixel array comprises ultraviolet light-emitting pixels.

21. The electronic device defined in claim 20 wherein the layers include a phosphor layer that creates visible light where struck by ultraviolet light from the pixel array.

22. The electronic device defined in claim 1 wherein the pixel array comprises an array of adjustable-transmission pixels.

23. The electronic device defined in claim 22 further comprising a backlight that produces backlight illumination for the array of adjustable-transmission pixels.

24. The electronic device defined in claim 23 wherein the backlight has a light guide layer and a light source that emits light into the light guide layer that is scattered out of the light guide layer to produce the backlight illumination.

25. The electric device defined in claim 23 wherein the backlight has an array of light-emitting diodes that produce the backlight illumination.

26. The electronic device defined in claim 1 further comprising a light source that produces ultraviolet light.

27. The electronic device defined in claim 26 wherein the layers comprise a phosphor layer that creates visible light where struck by the ultraviolet light.

28. The electronic device defined in claim 27 further comprising a filter that blocks ultraviolet light that overlaps the phosphor layer, wherein the light source comprises an array of ultraviolet light-emitting pixels in the pixel array.

29. The electronic device defined in claim 27 wherein the pixel array comprises an array of adjustable-transmission pixels, wherein the phosphor layer is between the array of adjustable-transmission pixels and the touch sensitive surface area, wherein ultraviolet light from the light source strikes the phosphor layer after passing through the array of adjustable-transmission pixels to create the visible light, and wherein the visible light passes through the louver layer and creates the illuminated reconfigurable touch controls on the touch sensitive surface area.

30. The electronic device defined in claim 29 further comprising a filter between the touch sensitive surface area and the phosphor layer that blocks ultraviolet light.

31. The electronic device defined in claim 29 further comprising a filter between the phosphor layer and the array of adjustable-transmission pixels that is configured to pass the ultraviolet light from the light source to the phosphor layer.

32. The electronic device defined in claim 1 wherein the louver layer comprises a plurality of electrically adjustable louvers.

33. The electronic device defined in claim 1 wherein the pixel array is not overlapped by a black masking layer.

34. The electronic device defined in claim 1 further comprising a non-black opaque masking layer having openings aligned with emission areas of the pixel array.

35. The electronic device defined in claim 34 wherein the non-black opaque masking layer has a checkerboard pattern or a striped pattern.

36. The electronic device defined in claim 1 wherein the layers include a layer of colloidal semiconductor nanocrystals that generates visible light where struck by ultraviolet light.

37. The electronic device defined in claim 1 wherein the layers comprise:
a first layer of quantum dots selectively quenched using a first control voltage;
a second layer of quantum dots selectively quenched using a second control voltage; and
a third layer of quantum dots selectively quenched using a third control voltage.

38. The electronic device defined in claim 1 further comprising:
a backlight that produces backlight illumination for the pixel array, wherein the backlight has a light guide layer and a light source that emits light into the light guide layer that is scattered out of the light guide layer to produce the backlight illumination and wherein the light guide layer has holographic optical elements formed on one or more substrate layers.

39. The electronic device defined in claim 1 further comprising:
a backlight that produces backlight illumination for the pixel array, wherein the backlight has a light guide layer and a light source that emits light into the light guide layer that is scattered out of the light guide layer to produce the backlight illumination; and
a lenticular lens film formed over the light guide layer.

40. The electronic device defined in claim 1 wherein the layers further include an image transport layer disposed between the pixel array and the louver layer and wherein the image transport layer comprises a coherent fiber bundle or is formed from a layer of Anderson localization material.

41. The electronic device of claim 1 wherein the layers are configured to provide the portion of the touch sensitive surface area with an appearance matched in texture to the appearance of the adjacent surface of the housing.

42. An electronic device having a touch sensitive region, comprising:
a touch sensor configured to gather touch input on the touch sensitive region;
louvers overlapping the touch sensor, wherein the louvers are tilted at a non-zero angle with respect to a surface normal of the touch sensitive region; and
a pixel array configured to produce light that passes through the louvers and creates illuminated touch controls on the touch sensitive region, wherein the louvers are configured to provide a colored appearance to the touch sensitive region when the pixel array is not producing light.

43. The electronic device of claim 42 wherein each louver comprises a louver core surrounded by a louver cladding and wherein the louver cores are tilted at the non-zero angle with respect to the surface normal of the touch sensitive region.

44. An electronic device having a touch sensitive surface area, comprising:
a pixel array that is configured to emit light, wherein the light creates reconfigurable touch controls on the touch sensitive surface area;
a touch sensor overlapping the pixel array and configured to gather touch input on the touch sensitive surface area; and a louver layer configured to provide a non-black appearance to a portion of the touch sensitive surface area in which no light from the pixel array is present, wherein the touch sensor is interposed between the pixel array and the louver layer.

* * * * *